(12) United States Patent
Hendrickson et al.

(10) Patent No.: US 8,576,343 B2
(45) Date of Patent: Nov. 5, 2013

(54) DIGITAL SIGNAL PROCESSOR (DSP) ARCHITECTURE FOR A HYBRID TELEVISION TUNER

(75) Inventors: Alan Hendrickson, Rollingwood, TX (US); David Trager, San Marcos, TX (US); Mitch Reid, Austin, TX (US); Li Gao, Austin, TX (US); John Khoury, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 1007 days.

(21) Appl. No.: 12/493,955

(22) Filed: Jun. 29, 2009

(65) Prior Publication Data

US 2010/0328536 A1 Dec. 30, 2010

(51) Int. Cl.
*H04N 5/44* (2011.01)

(52) U.S. Cl.
USPC ........... 348/725; 348/726; 348/729; 348/738; 348/705; 348/706; 348/731; 348/554; 348/558; 348/607; 375/316; 375/340

(58) Field of Classification Search
USPC ......... 348/554, 558, 725, 726, 705, 706, 607, 348/731, 738; 375/316, 340
See application file for complete search history.

(56) References Cited

U.S. PATENT DOCUMENTS

| | | | | |
|---|---|---|---|---|
| 4,872,054 A * | 10/1989 | Gray et al. | | 348/441 |
| 5,982,457 A | 11/1999 | Limberg | | |
| 6,369,857 B1 * | 4/2002 | Balaban et al. | | 348/555 |
| 7,075,585 B2 | 7/2006 | Favrat et al. | | |
| 7,206,025 B2 * | 4/2007 | Choi | | 348/441 |
| 7,239,264 B2 | 7/2007 | Cherniakov | | |
| 7,265,792 B2 | 9/2007 | Favrat et al. | | |
| 7,369,835 B2 | 5/2008 | Margairas et al. | | |
| 7,477,325 B2 | 1/2009 | Zhu et al. | | |
| 7,477,326 B2 | 1/2009 | Jaffe | | |
| 7,973,861 B2 * | 7/2011 | Abdelgany et al. | | 348/731 |
| 2002/0003586 A1 | 1/2002 | Busson et al. | | |
| 2004/0061804 A1 * | 4/2004 | Favrat et al. | | 348/554 |
| 2004/0259512 A1 | 12/2004 | Busson et al. | | |
| 2005/0036073 A1 * | 2/2005 | Bae et al. | | 348/732 |
| 2005/0265486 A1 | 12/2005 | Crawley | | |
| 2006/0222115 A1 | 10/2006 | Dornbusch et al. | | |
| 2007/0080840 A1 | 4/2007 | Ruitenburg | | |

(Continued)

FOREIGN PATENT DOCUMENTS

WO WO 03/067877 8/2003

OTHER PUBLICATIONS

Micronas, "DRX 3960A Digital Receiver Front-End," Feb. 8, 2001, pp. 1-30.

(Continued)

*Primary Examiner* — Jefferey Harold
*Assistant Examiner* — Mustafizur Rahman
(74) *Attorney, Agent, or Firm* — Trop, Pruner & Hu, P.C.

(57) ABSTRACT

According to one aspect, a mixed-signal tuner for analog and digital TV reception incorporates a demodulator for analog TV, employing various features for resolving limitations of the analog circuitry and for achieving compatibility with various global TV standards. Such features, which may be present in one or more embodiments, include the use of a variable sample rate in all digital clocks for frequency planning, and use of a microcontroller (MCU) to control various circuitry of the tuner.

22 Claims, 8 Drawing Sheets

(56) References Cited

U.S. PATENT DOCUMENTS

2007/0287402 A1 12/2007 Feng et al.
2009/0213275 A1 8/2009 Trager
2010/0157164 A1* 6/2010 Katiner .................. 348/726

OTHER PUBLICATIONS

NXP, "TDA 8295 Digital Global Standard Low IF Demodulator for Analog TV and FM Radio," Feb. 4, 2008, pp. 1-77.

Xceive, "Welcome to Xceive at CES 2007, Upgrade Your Tuner! Get XC5000," 2007, pp. 1-28.
Xceive, "XC5000 Product Brief," Dec. 2006, pp. 1-2.
U.S. Appl. No. 12/323,040, filed Nov. 25, 2008, entitled "Low-Cost Receiver Using Automatic Gain Control," by Ramin K. Poorfard, et al.
U.S. Appl. No. 12/551,146, filed Aug. 31, 2009, entitled "Digital Phase Lock Loop Configurable as a Frequency Estimator," by Li Geo, et al.

* cited by examiner

DIGITAL SIGNAL PROCESSOR (DSP) ARCHITECTURE FOR A HYBRID TELEVISION TUNER

BACKGROUND

Conventionally, television tuners were formed using multiple analog components. Such tuners are typically referred to as can tuners, and typically include many analog components (e.g., up to 100 or more) including amplifier, surface acoustic wave (SAW) filter, other filters and mixers and so forth that combine to form the analog television tuner.

As semiconductor technologies continue to improve, advancements have been made in forming a television tuner using semiconductor devices. However, generally the need for off-chip components such as a SAW filter or other external analog components is still present. Furthermore, conventional tuners and semiconductor tuners are typically manufactured for a given type of television signal (i.e., analog or digital) and standard and thus do not provide for ready incorporation into systems for use with varying television standards. At the least, significant manufacturing challenges with regard to tuning of off-chip components and re-configuration of the tuner, as well as the expense of exotic semiconductor processes used.

That is, worldwide television standards can vary significantly in the frequency ranges at which signals are transmitted, the types of modulation and encoding of the signals, and the different frequencies to which the received signals are downconverted and processed. Still further, different standards with regard to sound information present in television signals also exist, which can lead to complications in trying to adapt a given tuner device to a particular system.

SUMMARY OF THE INVENTION

According to one aspect, the present invention is directed to a CMOS mixed-signal tuner for analog and digital TV reception incorporating a demodulator for analog TV employing various features for resolving limitations of the CMOS analog circuitry and for achieving compatibility with various global TV standards. Such features, which may be present in one or more embodiments, include the use of a variable sample rate in all digital clocks for frequency planning, and use of a microcontroller (MCU) to control various circuitry of the tuner. In one implementation, such control may include calibration of analog functions, determination of operating mode and configuring the DSP accordingly, managing RF channel selection, sample rate selection, and gain controls, and providing the ability (e.g., by patch or code download) to maintain and revise-device operating characteristics.

Still further, an integrated mixed-signal gain AGC system coordinated by the MCU may be present. Signal level metrics can be provided to the MCU from various points in the mixed-signal data path to enable gain controls at these different points. A configurable digital IF gain compensation block can be coupled to a decimated complex ADC output to correct for gain transfer function non-idealities, the configuration of which can be determined by the MCU according to predetermined characteristics of the IF analog circuitry, and the transfer function may be real-valued. In turn, a digital configurable step AGC compensation circuit can be coupled to the output of the IF gain compensation block to provide fine gain control when operated in conjunction with a relatively coarse gain adjustment in the analog front end. This block may receive a timing signal by which application of the gain changes may be synchronized to the coarse analog gain adjustment and further synchronized to one or more predetermined desirable locations in an ATV waveform such as a blanking interval or other instance. Note that this step ACG compensation block gain control signal can be configured by the MCU.

A digital configurable DC step compensation circuit can be coupled to the output of the step AGC compensation circuit to provide fine overall control of the mixed-signal path DC offset when used in conjunction with relatively coarse analog gain steps with associated coarse DC offset steps. This step circuit can also be configured by the MCU, and may receive a timing signal by which application of the DC offset changes may be synchronized to the coarse analog gain adjustment and further synchronized to some predetermined desirable location in the ATV waveform. A digital IF phase compensation circuit can be coupled to the output of the DC step compensation circuit and be configured by the MCU according to predetermined IF analog phase response characteristics. Also provided in some embodiments may be a configurable spectrum reversal circuit, allowing optional performance of the function Y(Omega)=X(−Omega). The MCU may configure this circuit according to predetermined conditions, such as the expected orientation of the TV signal within the spectrum of the received channel. In addition, many of the above-described functions can be reordered (to the extent that they all operate on the channel located at a low IF input frequency), where tradeoffs in order can be made for efficiency.

A configurable digital downconverter may perform a complex frequency shift of the desired channel. The value of the frequency shift can be determined by the MCU according to a predetermined frequency plan and may be responsive to a dynamic automatic frequency control (AFC) algorithm calculated by the MCU. The downconverter may further perform the complementary frequency shift of the image channel. In some embodiments, a decimation block coupled to the signal and image outputs of the downconverter may reduce sampling rate, permitting fewer calculations in downstream signal processing blocks which may reduce device power consumption, RF interference, and die area. In one embodiment, a configurable dual-channel real-valued channel filter can be coupled to and operate on the two complex outputs of the decimator, configured by the MCU according to the expected channel bandwidth of the desired signal.

Then a digital image rejection filter, coupled to the channel filter outputs can minimize correlation between signal and image channels, thereby correcting circuit mismatches in the separate I and Q IF paths in the analog front-end. This filter may have parameters configured by the MCU and may be manipulated according to a determination of the magnitude of such mismatch as measured and reported to the MCU by the image rejection filter block. In turn, a configurable digital ZIF AGC block can be coupled to the output of the image rejection filter to optimize the digital word width and strategically locate the level of the resulting output within the dynamic range of its reduced bit-width digital word, and which can be controlled by a gain control signal configured by the MCU according to various signal level measurements and characteristics of the desired channel. The gain control signal can be applied to the signal path based on a timing signal, allowing synchronization to one or more predetermined desirable locations in the signal waveform.

A configurable digital RF gain compensation block can be coupled to the output of the ZIF AGC block, also configured by the MCU to compensate predetermined gain transfer function characteristics of the RF portion of the analog receiver. Again, some of the above functions can be reordered (to the extent that they all operate on the channel located at ZIF), where tradeoffs in order can be made for efficiency.

An interpolation filter can be coupled to the ZIF signals to increase the sampling rate above the Nyquist rate ahead of frequency translation in a downstream FPLL block for ATV demodulation. The interpolation filter can be alternatively coupled to the output of a video FIR filter, e.g., through a rounding operator circuit, for low-IF (LIF) ATV or DTV tuning only, where the determination of the input source is made by the MCU according to the operating rhode of the device. In turn, a configurable digital FPLL can be coupled to the output of the interpolator to translate the ATV signal from ZIF to baseband, where the FPLL is configured by the MCU according to expected signal characteristics and receiver synchronization lock status measured and reported by the FPLL to the MCU. Then, a digital complex Nyquist-slope filter is coupled to the complex output of the FPLL, providing the Nyquist-slope characteristic in the region $-Fvsb<f<Fvsb$, and approximately 0 dB in the region $Fvsb<f<Fvbw$, where Fvsb is approximately 750 kHz and Fvbw is approximately 5.5 MHz, in one embodiment. Note that calculations are made only for the real component $y\_r(n)$ of the complex filter resultant $y(n)=x(n) (conv) h(n)$, the complex transfer function of which provides rejection of the left-adjacent channel. A Nyquist rescale block can be coupled to the output of the Nyquist filter to automatically detect and correct inversion of the baseband composite video signal and to adjust the digital common mode (DC level) of the signal to optimize headroom in downstream signal processing blocks.

In addition, a series of configurable digital filters (referred to as "video filters") may be provided, including IIR notch filters for sound trap, gain stage, FIR filters for adjacent channel rejection and transfer function shaping, and all-pass filters for phase transfer function shaping. Each filter or gain stage can be configurable by the MCU according to the specific transmission standard, the device operating mode (e.g., as a tuner or a full ATV demodulator), and the sample rate selection. Note that the video FIR element can be configured to operate on either real-type data or complex-type data by the MCU according to device operating mode. In addition, the video FIR element can be selectively repurposed under MCU control as a ZIF channelization filter for LIF ATV or DTV operating mode, by selecting as its input the ZIF IQ signal.

A CVBS AGC block coupled to the CVBS output of the series of configurable filters may employ a DPLL to identify and lock on the horizontal line timing, report horizontal and vertical blanking interval timing and synchronization status to the MCU, and provide a means for measuring the amplitude of the CVBS output of the video filters and configurable gain and offset controls (i.e., CVBS AGC controls, which can be manipulated by the MCU to regulate the device output CVBS amplitude). In addition, the timing reference for some predetermined desirable location in the video waveform can be established at which to cause coarse analog AGC steps in coordination with finer, compensating digital AGC step compensation events, DC correction steps, ZIF AGC gain steps, and CVBS AGC controls.

Then, a collection of digital signal processing blocks including a complex frequency shifter, an FIR filter, and an AGC block incorporating a signal level detector and gain control under MCU control, can be selectively applied as components in a television sound demodulator or alternatively as final frequency translation and level adjustment operations on the signal path for a LIF ATV or DTV operating mode. In turn, a digital DAC multiplexer and interpolation block can be coupled to the demodulated CVBS, the sound demodulator output, and the LIF tuner output signals, the input source of which is configured by the MCU according to device operating mode to select the type of data presented on the output through a pair of DAC's and to increase the sampling rate to a frequency high enough to make in-band distortions at the DAC outputs negligible. In some implementations a serial digital interface (SDI), coupled to the output of this block, can transmit the output signals to circumvent the DAC outputs, thereby eliminating a noise source and a drain on power. Also, a serial communications link, such as an $I^2C$ link, may enable the user of the device to communicate with the MCU to establish operating mode and desired signal expectations.

DETAILED DESCRIPTION

Embodiments provide a television video and sound demodulator having a collection of digital signal processing and control circuits developed to work in conjunction with a television tuner to perform processing and demodulation of signals of all world-wide analog TV standards as well as to condition signals of all world-wide digital TV standards for demodulation in subsequent digital TV demodulator circuits.

Components within a digital part (e.g., digital signal processor (DSP)) of a device may compensate for non-idealities in the television tuner, thereby allowing optimizations in television tuner architecture to improve any of several desirable tuner characteristics, including performance, power consumption, die area, and implementation in a complementary metal-oxide-semiconductor (CMOS) silicon process. These components control, for example: discrete gain step control for automatic gain control (AGC); discrete DC gain step control for AGC; compensation for a radio frequency (RF) tracking filter; image rejection calibration for a low intermediate frequency (IF) tuner architecture; a microcontroller for flexible system control of all tuner functions; filters configurable per television transmission standard to replace a traditional surface acoustic wave (SAW) filter and to compensate non-idealities in the tuner video transfer function. In addition, in some embodiments various other components can be used to aid in processing. As examples, several level detectors capture signal levels supporting gain plan optimization. Further, a rate of digital clocks may be configurable to facilitate spur avoidance in the tuner. An invertible spectrum can be handled to support high-side or low-side injection mixing, along with configurable variables including configurable low IF input frequency, configurable selection of a sound output, configurable selection of TV sound standard, and optimization for FM overmodulation on the sound carrier. In some embodiments, the DSP can operate with a LIF or ZIF tuner and handle low-side mixing and spectral inversion. In some embodiments, DC offset correction timing can also be synchronized by the ATV demodulator timing information.

Components of the DSP can be connected in such a way as to optimize performance for analog television under normal and impaired conditions. Examples of impaired conditions include large desired signal level, small desired signal level, RF blockers, low signal-to-noise, over modulation of the television video signal, incidental carrier phase modulation (ICPM), incidental carrier frequency modulation (ICFM) on the video carrier, and amplitude modulated RF input. Still further, components of the DSP can be reconfigured under microcontroller control to provide signal processing appropriate for digital television standards with extremely low overhead cost.

Figure 1:
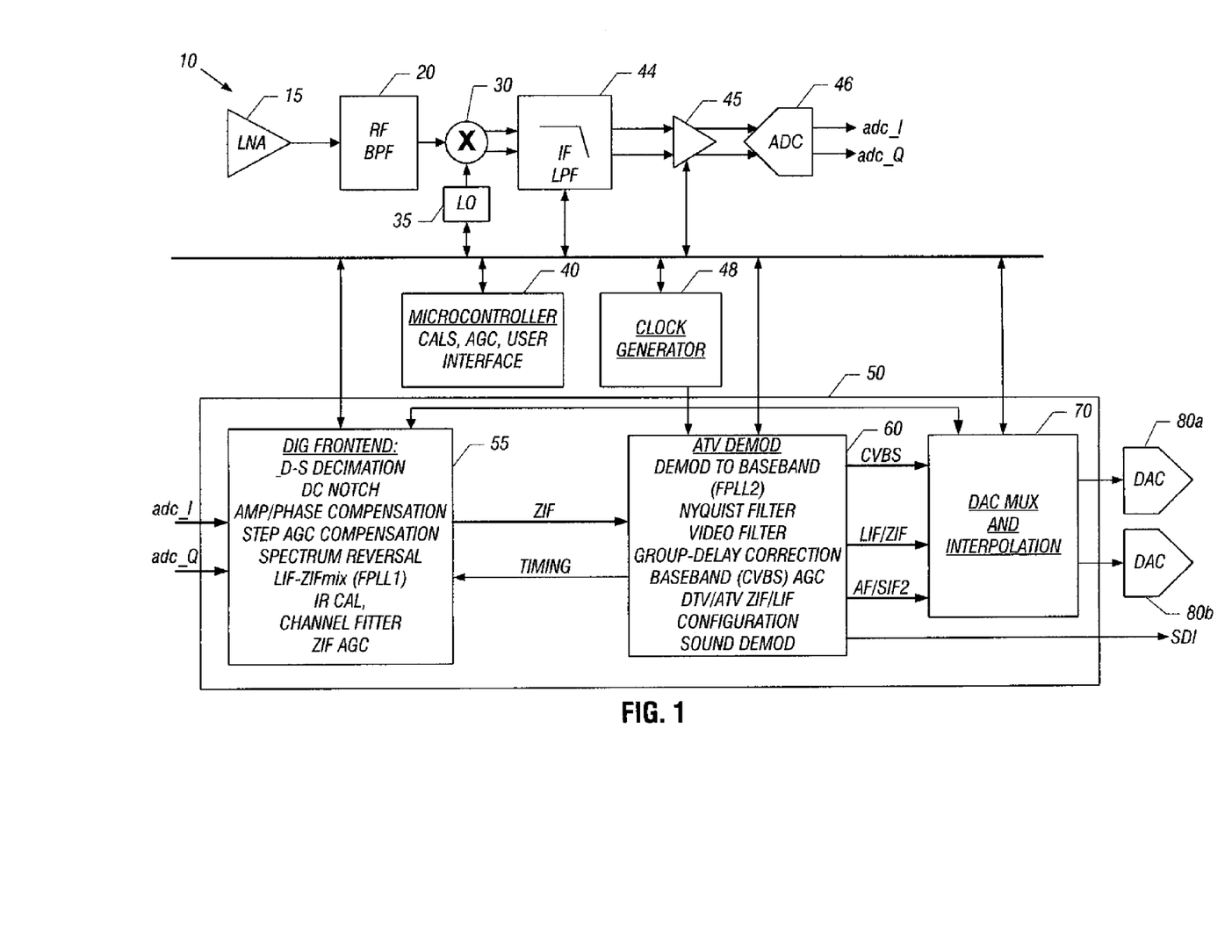
FIG. 1 is a block diagram of a television tuner/demodulator in accordance with one embodiment of the present invention.

Referring now to FIG. 1, shown is a block diagram of a television tuner/demodulator in accordance with one embodiment of the present invention. As shown in FIG. 1, the tuner/demodulator may be implemented as a single chip integrated circuit (IC) 10, which may be implemented on a single semiconductor die including both analog and digital circuitry, in one embodiment. In the embodiment of FIG. 1, incoming radio frequency (RF) signals are provided to a low noise amplifier (LNA) 15, which may provide variable gain based on control of a microcontroller unit (MCU) 40. The amplified signals may be provided to a filter 20 which in one embodiment may be a set of tracking filters to filter the amplified signal over a relatively wide bandwidth, as embodiments may be applicable for signals ranging from approximately 88 MHz to approximately 1 GHz. Due to the RF input dynamic range to accommodate required levels of both desired signal and RF blockers, these passive tracking filters of the analog circuitry provide rejection of blockers. To effectively reject blockers, there is some distortion of frequency response, both gain and phase, of the desired channel. Likewise, anti-aliasing filters 44 in the IF circuitry applied prior to analog-to-digital (A/D) conversion distort the signal. Thus as described further below, compensation filters can be placed at a location in the signal processing chain at which digital filters with real-valued transfer functions, i.e., even symmetric about DC, can effectively perform the compensation. Real-valued filters are inexpensive to build relative to complex-valued filters. In some embodiments, firmware configures the filters according to predefined programming tables according to anticipated characteristics of the selected tracking filter and ADC anti-aliasing filter.

After filtering, signals are provided to a mixer unit 30 which may downconvert the signals, also under control of MCU 40. In the embodiment shown in FIG. 1, a local oscillator (LO) 35 may provide a mixing signal, where the frequency of the mixing signal is controlled by MCU 40. Depending on a given television standard associated with the incoming signals, the RF signals may be downconverted to a low IF or zero IF. As shown in the embodiment of FIG. 1, the signals output from mixer 30 may be complex signals having both in-phase (I) and quadrature-phase (Q) components. Further filtering may occur in an IF low pass filter (LPF) 44. Then the downconverted signals may be gain controlled using a programmable gain amplifier 45, and then digitized in a digitizer such as an analog-to-digital converter (ADC) 46. These digitized I and Q values may be provided to a digital portion of IC 10, namely a DSP 50 that includes various functionality, and which may be generally separated into a digital front end 55, a demodulator 60, and a multiplexer/interpolation unit 70. While shown with this particular implementation in the embodiment of FIG. 1, understand the scope of the present invention is not limited in this regard.

As described above, the analog and digital blocks may be operated under control of MCU 40. In this regard, MCU 40 may perform various calibrations, provide for control of AGC functions, along with providing a user interface, e.g., to receive information regarding a given standard for a system in which the tuner/demodulator is adapted. As further shown in FIG. 1, a clock generator 48 may be present and may be coupled to the various components in both the analog front end as well as DSP 50. Clock generator 48 may generate digital clocks to control operation of the various components at different frequencies depending upon the frequency of an incoming selected channel. That is, the digital components of DSP 50 can be designed to operate with a frequency-agile clock to reduce harmonics and sub-harmonics of digital clocks that may interfere with RF reception. Accordingly, in various embodiments depending upon a frequency of at least one of an incoming RF signal, an IF signal and/or a mixing signal, the digital clock provided to various components can be adjusted to a different frequency to reduce noise in the analog front end due to harmonics or sub-harmonics of the digital clock that could interfere with RF reception. In various embodiments, such interfering tones may be placed in an innocuous part of an RF spectrum with respect to a desired signal channel frequency.

Digital front end 55 may perform various functions, including decimation, DC notch filtering, amplitude/phase compensation, step AGC compensation, spectrum reversal, LIF to zero IF (ZIF) mixing, image rejection (IR) calibration, channel filter, and ZIF AGC. After such processing, digital front end 55 may provide a ZIF signal to demodulator 60 which may perform analog TV demodulation in a system that is receiving ATV signals. Even where the demodulator is configured for use as a tuner such that an analog IF signal is sent to another system component, e.g., a separate demodulator chip, demodulator 60 may perform various functions to obtain information (e.g., timing information) needed for control of gain operations.

In various embodiments, demodulator 60 may perform functions including a demodulation to baseband using a frequency phase lock loop (FPLL), Nyquist filtering, video filtering, group-delay correction, baseband (CVBS) AGC, DTV/ATV ZIF/LIF configuration, and sound demodulation. Accordingly, the output from demodulator 60 may, depending upon a mode of operation, be a CVBS signal, a LIF/ZIF signal, and/or an AF/SIF signal. Still further, DTV signals may also be minimally processed in demodulator 60. All these signals may be provided to a DAC/interpolation block 70, where selection of a given DAC for the different signal types may be performed, in addition to interpolation where sampling to a different sample rate may be required.

In one embodiment, the: multiplexer block 70 may provide different signals to the different DACs, namely a first DAC 80a and a second DAC 80b. Within multiplexer and interpolator block 70, a final interpolation is provided to place DAC sampling images at a high enough frequency to be easily removed in the analog domain, and thereby reducing dynamic range requirements on subsequent signal processing circuits. Final gain and offset adjustments in block 70 prior to the DAC may be provided to enable flexibility in final gain scaling and offset. An ADC may be provided for level control of the output signal. The downstream device drives an analog control voltage, which is read by the firmware through the ADC and is then translated into a gain written into the output gain adjustment of an AGC component present in demodulator 60 or block 70.

Still further, as seen in FIG. 1, a serial digital output may be provided by demodulator 60. This serial digital output may enable DTV signals that are minimally processed in the modulator 60 to be digitally sent out of IC 10 without the need for conversion to analog signals and then the re-conversion back to digital signals in a digital demodulator to which the IC can be coupled. Accordingly, noise and other spurious signal degradation resulting from the analog to digital conversion and vice versa can be avoided.

Referring now to Table 1, shown is an output configuration for different modes in which different incoming signals to block 70 may be provided to the DACs.

TABLE 1

| Mode | DAC1 | DAC2 |
|------|------|------|
| 1. | CVBS | AF or SIF2 |
| 2. | ZIF-I | ZIF-Q |
| 3. | LIF-I | LIF-Q |

While shown with this particular implementation in Table 1, the scope of the present invention is not limited in this regard.

Figure 2:
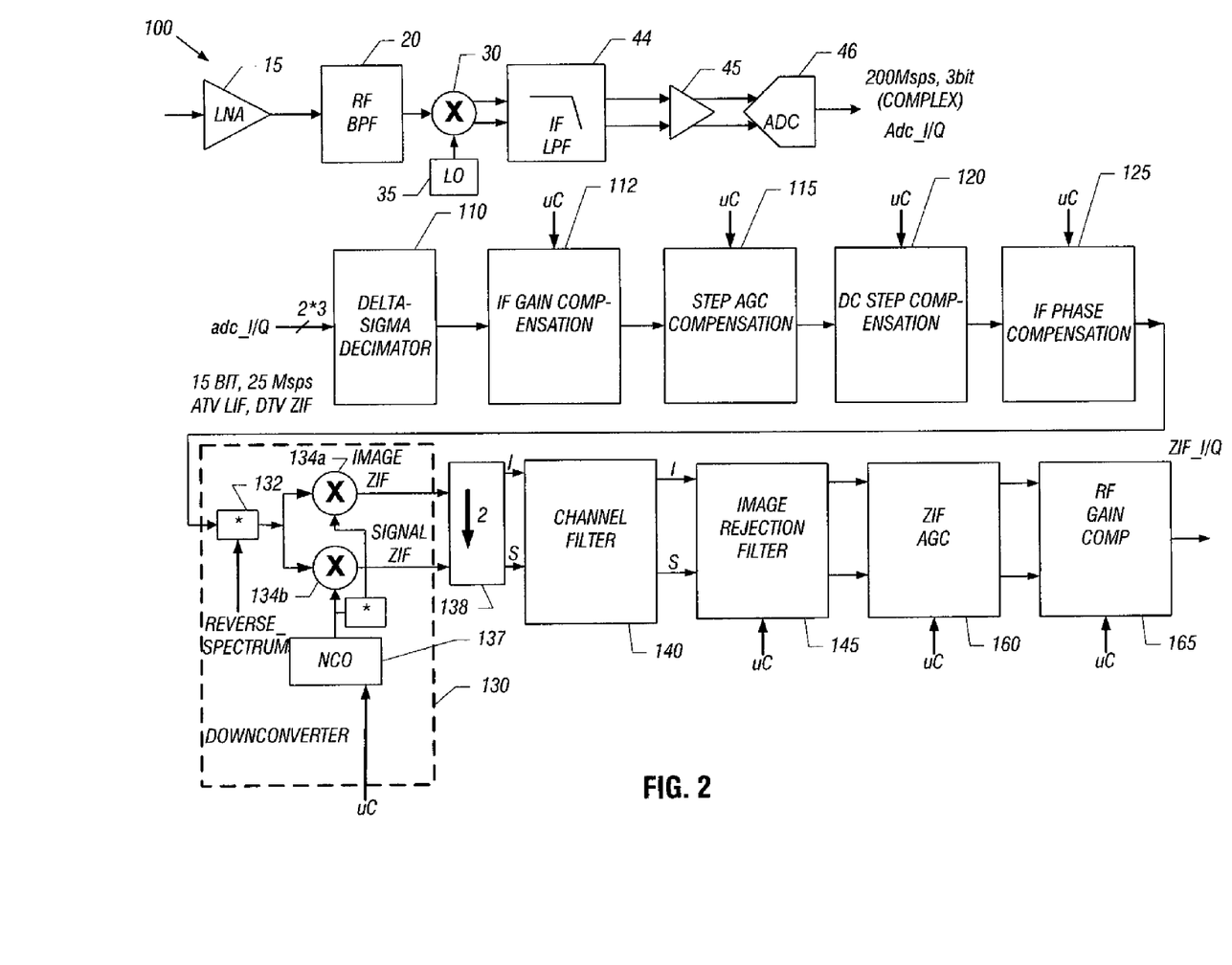
FIG. 2 is a block diagram of a digital front end of a DSP in accordance with one embodiment of the present invention.

Referring now to FIG. 2, shown is a block diagram of a more detailed implementation of a digital front end 100 in accordance with one embodiment of the present invention. As shown in FIG. 1, front end 100 is coupled to receive incoming complex signals, namely I and Q signals in a delta-sigma decimator 110, which re-samples the signals to a different rate, e.g., 25 mega samples per second (Msps) in one embodiment. The decimated signals are then provided to an IF gain compensation block 112, which may correct for analog IF gain response. Then the signals are provided to a step gain compensation block 115 which may provide compensation of the discrete AGC steps performed in the analog front end. As will be discussed further below, such compensation may be controlled by way of microcontroller 40. The step compensated signals are then provided to a DC step compensation block 120 which corrects for discrete AGC steps around a DC value. Then an IF/phase compensation may be performed in block 125. Such block may correct for analog IF group delay in RF and IF circuitry and may be performed under control of microcontroller 40.

Referring still to FIG. 2, the compensated signals are provided to a frequency shifter (FREQSHIFT1) 130. Frequency shifter 130 may operate to take the incoming signals which may be at a variable intermediate frequency depending on a given standard, and downconvert them to a zero IF. Specifically, as seen in FIG. 2, the incoming signals may be operated on by a reverse spectrum operator 132 in cases where spectrum reversal is needed. The signals are provided to a complex mixer 134 which mixes the incoming I and Q signals with a mixing signal having a frequency generated by a numerically controlled oscillator (NCO) 137 which may act as a frequency synthesizer to generate the mixing signal under control of the microcontroller to enable downconversion to IF frequencies.

The ZIF signals are provided to a decimator 138, which resamples the signals to a lower rate to reduce area cost and power consumption. Decimating the signal allows subsequent filters to be shorter in length (number of taps), therefore requiring fewer calculations and allowing more time to execute those calculations. In one embodiment, a rate of 12.5 Msps may be selected, which exceeds the maximum intended signal bandwidth of ±4 MHz about DC with some margin for flexibility of center frequency and sampling frequency. At the same time, decimation by two can be accomplished with a relatively inexpensive FIR filter without phase distortion. Still further, operation at the decimated rate allows sharing of multiplier resources by the channelization filter. The decimated signals are coarse channel filtered in a channel filter 140 which attenuates adjacent blockers, allowing a downstream FPLL to operate successfully. The filtered signals are then provided an image rejection (IR) filter 145 which operates to correct for IQ mismatch in the signals. Low-IF demodulators always have the technical challenge that the so-called image band aliases into the so-called signal band to some degree. Ideally this aliasing is zero, but in practical implementations the values are closer to −35 dB. Analog TV demands some −68 dB of image rejection, so embodiments may provide image rejection filter 145 to improve demodulator performance.

Finally, another gain control block, namely a ZIF AGC block 160 may perform gain control to reduce the data path width, e.g., from 14 bits to 12 bits, in one embodiment. ZIF AGC 160 may gain up the desired signal after removal of the interferer (by the earlier channel filter) to allow a reduction in the number of bits used to represent the data path, thereby reducing area cost and power consumption. Finally, an RF gain response may be corrected in an RF gain compensation block 165. Accordingly, front end 100 provides a complex ZIF output that is provided to a demodulator (e.g. demodulator 60 of FIG. 1) for further digital processing. While shown with this particular implementation in the embodiment of FIG. 2, the scope of the present invention is not limited in this regard.

Depending on a given system in which the tuner/demodulator is implemented and a given standard of received TV signals, different types of information may be provided out of digital front end 100 by way of the ZIF complex signals. For example, analog or digital TV signals may be provided out. In general, minimal processing may be performed on the digital signals before they are provided from the demodulator portion out to another chip for digital demodulation. In other implementations, analog TV signals may be fully processed and demodulated in the demodulator. Yet in other implementations, the analog signals may be output from the demodulator as IF signals to be demodulated off-chip. Accordingly, various functionality may be performed in different orders for a ATV demodulation and DTV processing.

Figure 3:
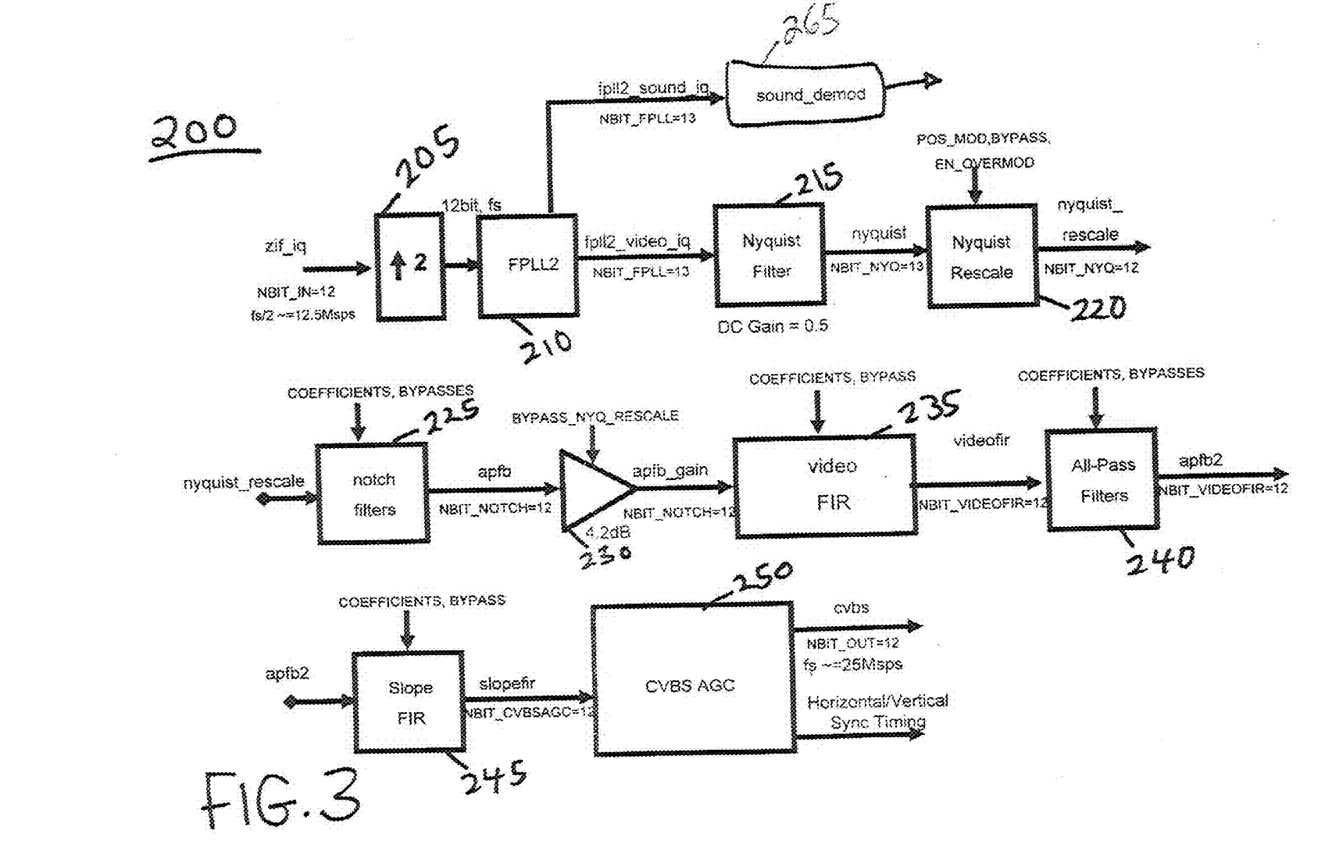
FIG. 3 is a signal path for ATV signals through a DSP in accordance with one embodiment of the present invention.

Referring now to FIG. 3, shown is a block diagram of a signal path flow for ATV signals through a DSP in accordance with one embodiment of the present invention. As shown in FIG. 3, signal path 200 may be part of the DSP and may include various video filtering that is performed on incoming ZIF IQ signals. First, the incoming signal may be interpolated to a resampled rate. For example, incoming signals may be received at a rate of approximately 12.5 mega samples per second (Msps) and resampled to a frequency of 25 Msps in interpolator 205. Interpolator 205 may increase the sample rate, as the following demodulation using a FPLL will locate the TV signal picture carrier at DC. For some TV standards (e.g., PAL 1), TV signal content resides as far up as 6.75 MHz above the picture carrier, making it unrepresentable as a real signal at the 12.5 Msps rate. Additionally, the FPLL's loop stability degrades with latency, and a higher sampling rate reduces latency. From interpolator 205, the signals may be passed through a FPLL 210 to obtain sound IQ signals to be passed to a sound demodulator 265.

FPLL 210 facilitates a coherent demodulator, in contrast to a conventional non-coherent envelope detection method of AM-VSB demodulation, which imparts certain undesirable distortions in the TV signal and is limited in its accommodation of overmodulation. The coherent demodulator avoids the distortions, handles overmodulation better, and has a SNR advantage over non-coherent detection, albeit at the cost of longer signal acquisition time. In a typical receiver, the actual transmitter carrier frequency is generally an unknown and filters, crystal references, etc, must be designed to tolerate 60 kHz or so of uncertainty. In a receiver in accordance with an embodiment of the present invention, however, the DC component of the FPLL's integral loop feedback signal can be used to read the transmitted carrier frequency with great precision and thereby to optimize configuration of the tuner and digital signal processing blocks. As examples, this information which may be fed back to the microcontroller can be used to adjust the center frequency of the RF tracking filter (to minimize in-band gain variations), to revise the LO used for RF-IF downconversion or the second (digital) LO (in FPLL 210) used for IF-baseband downconversion, or to adapt the digital sampling rate to avert in-band spurs. Furthermore, the video carrier at the FPLL output is at a well-known frequency (0 Hz), allowing downstream filters to be as relaxed as possible.

Then the separated video IQ signals at baseband may be provided to a Nyquist filter 215 for Nyquist filtering and then to a rescaler block 220 for rescaling. Nyquist filter 215 may be used to properly shape the AM-VSB signal spectrum, and its stop-band rejects the left-adjacent channel. In one embodiment, it is implemented using a complex baseband finite impulse response (FIR) Hilbert transformer. The FIR transfer function is formulated such that transition regions around DC and around half the sample-rate are mirror-image symmetric, allowing especially efficient implementation, as all even taps have zero-valued coefficients. The filter is further simplified by calculating only the real-valued component of the output, since the imaginary component will not be used. The filter is designed to meet the most rigorous of constraints determined by the combination of television transmission standard and selected sample rate.

Note that rather than calculating the envelope of the AM-VSB signal, the Nyquist filter output can be directly translated into the desired signal with less distortion and better noise performance as follows:

$$Yn=2*Re.\{Xn\_i-j*Hilbert\_transform[Xn\_q]\} \quad [\text{Eq. 1}]$$

Beside the performance advantage, one major reason to avoid using an envelope-detection method is distortion caused by the presence of the desired channel sound carriers in the FPLL output signal Xn. If the sound carriers are not sufficiently attenuated prior to envelope detection, they distort the video signal. A typical envelope detector must first suppress the sound carriers with a band-stop filter called a sound-trap. Such a band-stop typically distorts the video part of the spectrum in gain and phase, which requires correction. In a receiver in accordance with an embodiment of the present invention with the carrier at DC, the sound trap would necessarily be required to filter the complex signal and would therefore be more expensive to build than the selected alternative, which involves simply taking Yn, the real-part of the Nyquist filter output, and passing it through a real-valued sound-trap with a relatively inexpensive FIR filter without phase distortion.

In one embodiment, rescaler block 220 may provide for inversion detection. To support overmodulation of the AM-VSB signal, FPLL 210 allows a degree of freedom in its solution and can lock to the carrier either at 0° or 180°. As a result, the output of the FPLL can be either uninverted or inverted. An auto-inversion block within the rescaler removes the ambiguity and selectively re-inverts if necessary, based on time-domain characteristics of the resulting signal. In analog television standards L and L' the AM modulation itself is positive, whereas in all other analog standards it is negative. The block is configured to incorporate this expectation into the selective inversion. Such inversion detection may determine whether the PLL has inverted the signal by 180 degrees.

Figure 6:
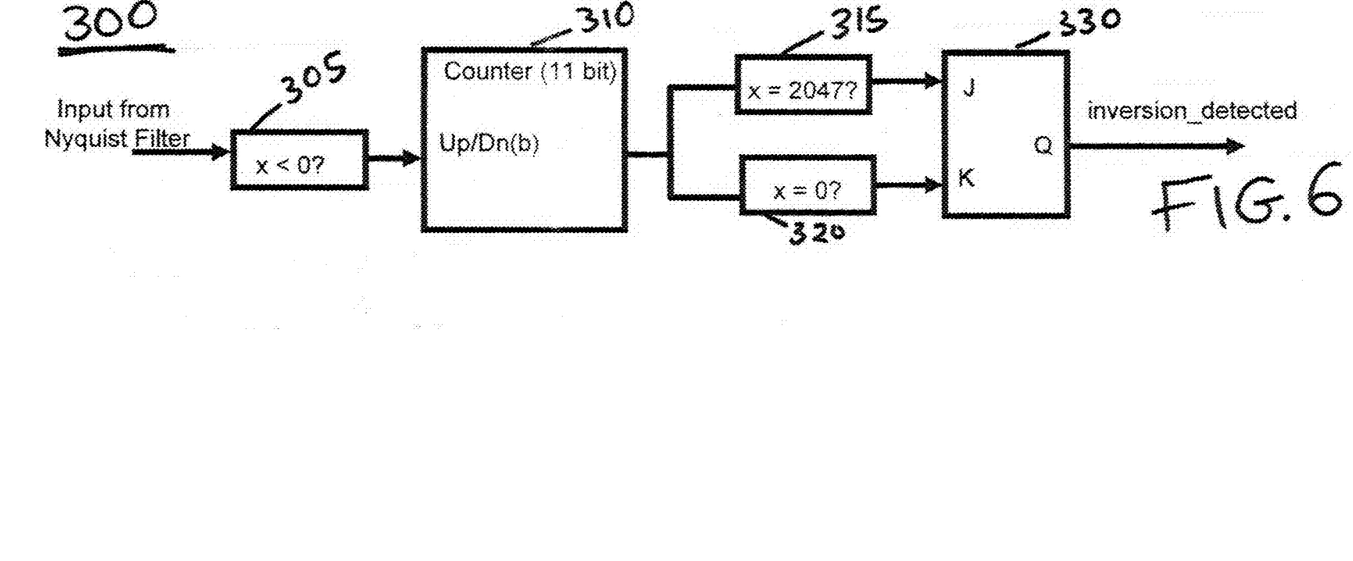
FIG. 6 is an implementation of an inversion detector in accordance with one embodiment of the present invention.

FIG. 6 shows an implementation of an inversion detector in accordance with one embodiment of the present invention. As shown in FIG. 6, inversion detector 300 may determine whether the output from Nyquist filter 215 has been inverted. As seen, detector 300 includes a logical operator 305 to determine whether the input from the Nyquist filter is negative. For an overmodulated signal, it is not the peak amplitude but rather the median value that is relevant, in other words whether the majority is above or below zero. In one embodiment, the detector looks at the most significant bit to determine the value, and updates the counter accordingly. If so, a count value of a counter 310, which may be an up/down counter may be incremented. Note that the counter is large enough to account for the vertical blanking interval, where the signal could be for an extended amount of time in one state or the other. The output of counter 310 may be provided to comparators 315 and 320 to determine whether the count output has reached its maximum level, which in one embodiment may be 2047, or whether the count value is equal to zero. If the counter has reached its maximum, a JK latch 330 may be set, indicating detection of the inversion. When the count value equals zero, this latch is reset. In one embodiment, the inversion detector may provide up roughly 1.25 lines of hysteresis in the decision, as a horizontal line has approximately 1600 samples at 25 MHz rate.

In one embodiment, the behavior of the FPLL in an overmodulation condition may be: negative AM (overmodulation at white), which cannot be overmodulated during the 9.8 microsecond (us) synchronization interval, could be overmodulated for the entire 53.8 us visible white line, where increasing the counter or making an asymmetric up/down scheme does not help; positive AM (overmodulation at black) with long low pulses during vertical synchronization, extending the counter by three bits (e.g., to 8 lines) resolves; positive AM (overmodulation at yellow, i.e., clipped, not inverted), which does not raise an issue; and conditions ameliorated by presence of a sound carrier, which causes the waveform to cross zero (a chroma carrier in negative modulation does the same). In one embodiment, auto-inversion may be disabled when the FPLL overmodulation feature is disabled, as no phase ambiguity exists. In other implementations, a firmware-based detector may be provided in the FPLL itself.

The rescaled signals may then be provided to a set of notch filters 225. Ultimately, the desired-channel sound carriers are rejected from the video signal to meet expectations of video signal-processing chips. In one embodiment, notch filters 225 may be implemented as a bank of four second-order notch filters, where each notch is of independent frequency and Q-factor. The second-order sections use a structure that is highly tolerant of coefficient truncation, reducing the size of hardware multipliers and thereby making them less expensive. The independent nature of the notches allows the use of the bank in various standards by configuring the coefficients. The sound carriers do consume some amount of dynamic range, so removing them early in the signal processing chain alleviates signal-processing overhead requirements in the subsequent filters. The filter coefficients are optimized according to TV standard and selected sampling rate. On the other hand, the sound trap location was chosen to be after the gain rescaling to improve quantization-noise performance in the sound trap infinite impulse response (IIR) filters. After notch filtering, the signals may pass through a gain block 230 and then be provided to a video filter 235, namely a video finite impulse response (FIR) filter.

After phase ambiguity correction in auto-inversion block 300, the normal analog TV composite signal (including sound carriers) is heavily DC biased, occupying by and large just the positive values of the two's complement data word, and therefore makes inefficient use of the hardware. A quantization noise performance improvement can be made by removing the DC bias and gain-scaling up. In one embodiment, to do this in an inexpensive way, the bias adjustment is fixed to −(¼ full-scale) and the gain adjustment is 1.5 (i.e., 4.2 dB) in gain block 230. These values were selected to avoid clipping distortion on a normal signal with reasonable expectations for signal levels. Note that gain scaling can be bypassed (e.g., under microcontroller control) to accommodate heavily over-modulated video.

Video filter 235 operates to correct gain flatness across the whole video band without affecting the group-delay corrected by the following all pass filters (APF) 240. The gain correction may include various corrections, including correction for ripple and roll-off in the coarse channelization filter, for roll-off of decimation and interpolation filters, for ripple in the Nyquist filter, and for gain characteristics in the sound trap notch filters. Furthermore, whereas the sound trap filters provide sharp, narrow-band rejection of close-in sound carriers, the FIR video filter stopband provides a broad stopband for all interfering tones above the predetermined video band. The filter has different requirements depending on the selected TV standard (e.g., 4.2, 5.0, 5.2, 5.5 MHz video bandwidth) and sampling frequency. The filtered signals may then pass through a set of APF 240, after which they may be provided to a slope filter 245, which in one embodiment may also be a FIR filter. Broadcast analog TV transmitters pre-distort video output to alleviate the burden of correcting group-delay due to sound trap filters, and the pre-distortion depends on the television standard. All-pass network 240 corrects any residual group-delay. Since the receiver is essentially linear-phase (i.e., zero group delay), the all-pass network's main task is to undo the transmitter pre-distortion expected according to the TV standard. In one embodiment, the all-pass filter 240 may be four individually configurable second-order IIR sections, again employing an architecture which is robust against coefficient truncation. The filter coefficients can be optimized according to TV standard and selected sampling rate.

Gain-slope filter 245 may offer an inexpensive means, from a customer support and program memory stand-point, to allow chroma vs. luma gain adjustment in discrete steps to meet the needs of various TV manufacturers. Finally, to compensate for step changes in the analog ADC blocks, ADC compensation may be performed in block 250 to provide a CVBS output along with a horizontal/vertical sync timing signal, which as will be described further below may be used to identify to MCU 40 the point at which gain control changes may be made. AGC 250 may be a back-porch AGC to identify a particular part of the video waveform with known characteristics, namely the back-porch following a horizontal synchronization tip pulse, in order to control the amplitude and offset of the final output composite video signal. For positive AM modulation standards (L, L'), in which the modulated RF envelope peak is a function of the video content, it offers a means to decouple the output level from the video content. For standards L, L', as well as for negative modulation standards in which the modulated RF envelope peak is essentially static, the mechanism decouples output signal level from AM-overmodulation. Furthermore, in advanced algorithms, the back-porch level information can be used to extend the system tolerance of high-luminance signals (i.e. >133 IRE black-to-video) by selectively attenuating the CVBS signal, compromising system gain for improved clipping behavior.

In one embodiment, the back-porch AGC 250 includes a digital phase-lock loop (DPLL) responsible for estimating the location in time of the video back-porch. The back-porch timing estimate is forwarded to the tuner portion of the chip and to the digital front-end to time sensitive gain steps to occur such that resulting transients are located in a position outside the visible video image on a typical TV monitor, as described further below. The ability to provide such timing information facilitates discrete gain steps, which in turn facilitates improved noise figure and lower power consumption. The detection of the back-porch also confirms synchronization of the receiver to the transmitter, and its success or failure may be used by firmware as a key to re-initialize synchronization. Additionally, the DC value of the DPLL integral path can be used by firmware to measure the average period of the horizontal line and thereby determine whether the received signal is NTSC (63.49 us) or PAL/SECAM(64 us). Note that the various blocks shown in FIG. 3 may be implemented in hardware, software, and/or firmware of the DSP and it is to be understood that the signal path is a representation of execution of these functions within the DSP.

Figure 4:
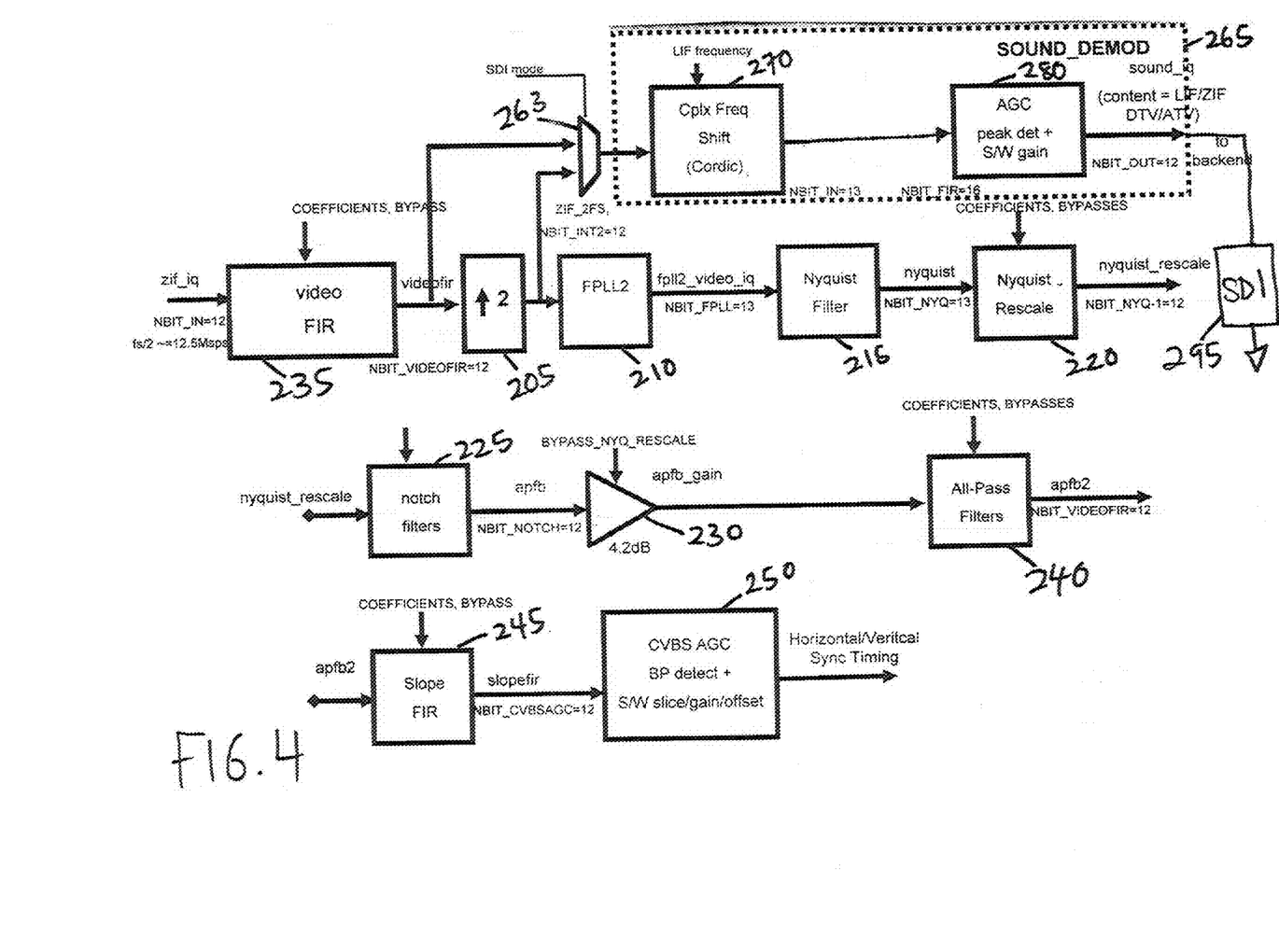
FIG. 4 is a signal path for DTV signals through at least some of the same functions of the DSP in accordance with one embodiment of the present invention.

Now referring to FIG. 4, shown is a signal path for DTV and hybrid video signals through at least some of the same functions. Note that a different order of operations is present in FIG. 4. Specifically, note that video filtering via video FIR 235 may be performed at a front end. Also note that in the embodiment of FIG. 4, details of sound demodulator 265 are shown. However, in this case of DTV signals (or ATV signals that are to be output from the chip for off-chip demodulation), sound demodulator 265 may be re-used for frequency translation, equalization (i.e., shaping the frequency response), and gain adjustment, rather than for demodulation. Thus as shown in FIG. 4, various blocks of sound demodulator 265, including a complex frequency shift operator 270, which may be implemented as a coordinate rotation digital computer (CORDIC) function may be performed to shift the ZIF signals to a LIF frequency, e.g. under control of a frequency information signal from the microcontroller. Finally, a gaining operation may be performed on the signals in an AGC gain block 280, which again may be performed under control of the microcontroller. Note that in some implementations block 280 may further include a peak detector and software gain operations to thus provide output of sound IQ signals at a controlled level. Thus the output from sound demodulator 265 in this instance is not demodulated sound, but rather LIF/ZIF analog or digital TV signals to be sent through a back end of the chip and to an off-chip demodulator. In some implementations, to avoid the need for multiple conversions between digital and analog, DTV signals may instead be provided through a serial data interface (SDI) such that digital information may be directly provided from the chip to the off-chip digital demodulator.

A single architecture can thus efficiently support digital TV signal processing in addition to the analog processing described above. Various blocks may be re-ordered to support a low-IF output for digital TV for very little cost or complexity. By deferral of interpolation of the signal from 12.5 to 25 Msps until after the video FIR in the DTV mode, the video FIR filter can be reconfigured from a long filter for real ATV data to a shorter filter for complex DTV data. Furthermore, it allows connection at this lower rate via a direct serial digital interface (SDI) to downstream DTV processing devices supporting SDI input, for robust, low power data transfer, eliminating the DAC and ADC typically required at this interface.

When processing analog TV to provide an ATV IF signal to an off-chip demodulator, the majority of the demodulator remains functional even though the demodulated result is unobserved using an embodiment of the present, as the AGC steps need timing information to remain un-noticeable. For the IF output mode, the architectural blocks required to identify and time the back-porch remain operational. After the ZIF input, the 12.5 Msps signal is first brick-wall filtered in the video FIR, and then interpolated up to 25 Msps. The 25 Msps signal drives the FPLL, which moves its carrier to DC. After that, the ATV Nyquist filter, rescaling, auto-inversion, sound notch, all-pass, and gain-slope correction filters operate on the signal, and the gain-slope filter output is presented to the CVBS back-porch AGC for timing recovery.

Figure 5:
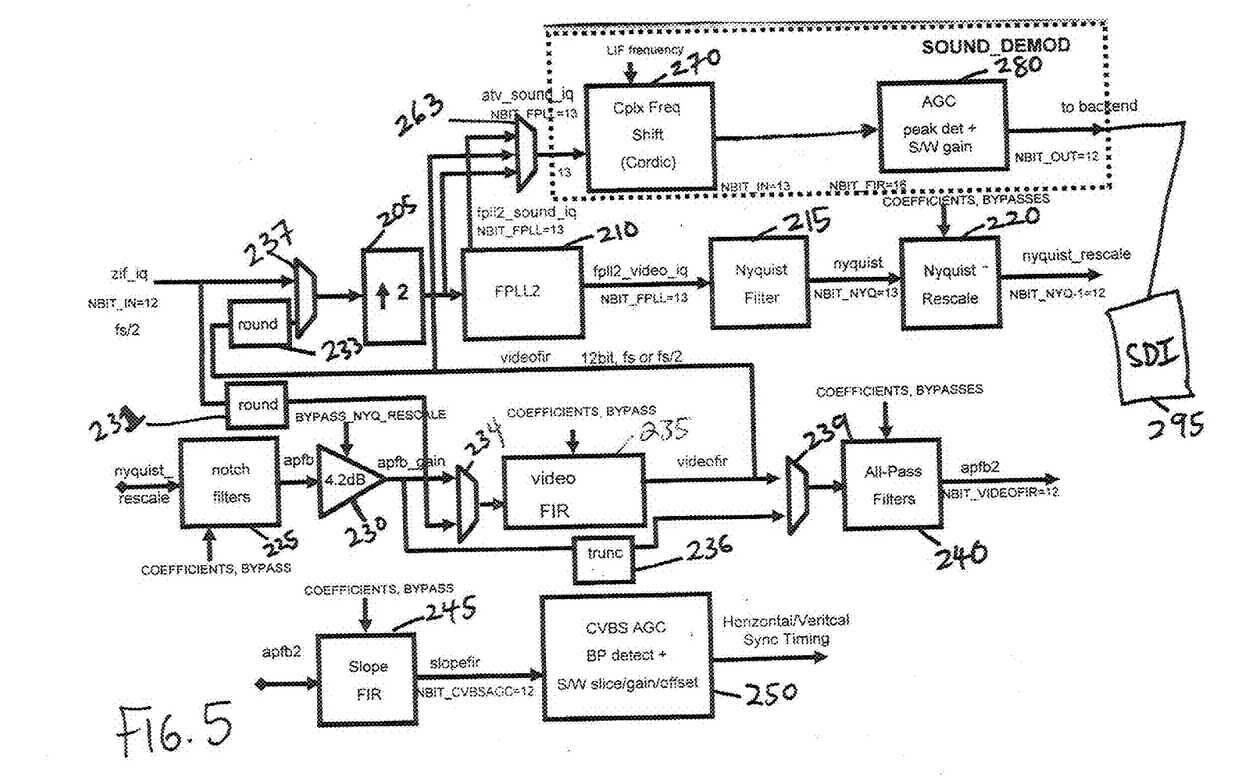
FIG. 5 is a view of a combined signal path for ATV and DTV signals through a DSP in accordance with one embodiment of the present invention.

Referring now to FIG. 5, showing is a conceptual view of the combined signal paths for ATV and DTV signals through the DSP. To implement the different operations performed on these different signals in the different orders described above, various multiplexers and other operators may be present to realize the functionality. As seen in FIG. 5, the function blocks remain the same, and further illustrated are multiplexers, including a front end multiplexer 237, a video filter multiplexer 234, and an all pass multiplexer 239. In each of these multiplexers, the top path is the ATV signal path, and the bottom path is the DTV signal path. Note that with regard to the DTV signals, various mathematical operators may be present in the signal paths, i.e. rounders 231, 233 as well as a truncator 236, which acts to round or truncate, respectively the digital signals to provide for efficient operation. Note by way of multiplexers 234 and 237, DTV signals may be routed through video filter 235 and then provided to interpolator 205. FIG. 5 further shows a SDI block 295 which may act as an interface to enable transmission of direct DTV signals from the chip to an off-chip digital demodulator.

For ATV signals this sound demodulator path may perform sound demodulation based on the incoming signal, which may be received either from the output of interpolator 205 or from FPLL 210, as controlled by a multiplexer 263. Thus sound can be sourced from nodes either after or before FPLL 210, offering a trade-off between the frequency accuracy afforded by the operation of the FPLL and exclusion of the additive noise of the FPLL. When taken prior to the FPLL, the configuration is most like a quasi-split sound (QSS) architecture; when taken after the FPLL, it is most like an intercarrier architecture. In systems in which there is a large amount of phase noise on the video carrier, e.g., where there is ICPM or perhaps when the signal has been through several repeaters, the QSS model may be preferable. For the intercarrier selection, the signal may be selected prior to or after phase correction for ICPM in order to maintain flexibility.

Analog TV video performance is very sensitive to gain controls, which are conventionally of a continuous-voltage or continuous-current nature. Such continuous-voltage or continuous-current gain circuits generally demand high current in CMOS applications to achieve the desired performance, whereas discrete steps can be implemented at lower cost in die area and power consumption. However, by applying such discrete steps, a side effect of ordinarily visible video artifacts can occur. Thus in various embodiments, the microcontroller or other gain control circuitry can mitigate the artifacts by inserting one or more discrete analog gain steps in analog front end circuitry, and then smoothing out the step(s) in the digital domain. Furthermore, the gain steps (both analog and digital) can be timed based on detection of video horizontal line and vertical timing to occur at a location in the video frame that is least sensitive to such gain steps. Also because each analog circuit has a DC offset associated with it, for each gain step there may be an associated correction of DC offset.

Figure 7:
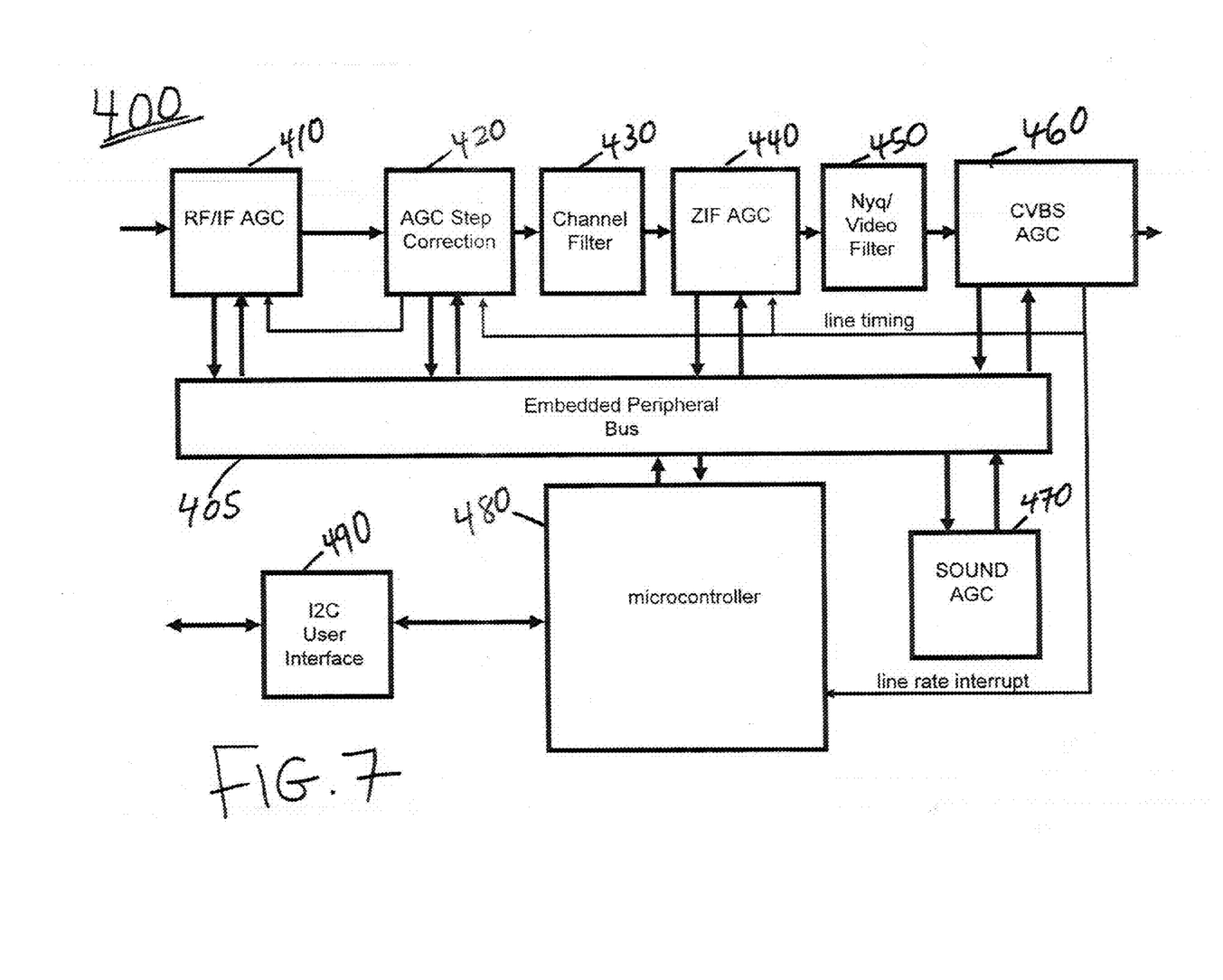
FIG. 7 is a block diagram of an AGC subsystem in accordance with an embodiment of the present invention.

Referring now to FIG. 7, shown is a block diagram of an AGC subsystem that may be present in a television tuner in accordance with an embodiment of the present invention. As shown in FIG. 7, AGC subsystem 400 includes various gain control knobs that can be provided along various portions of a signal processing path, at RF, IF, and baseband frequencies. Specifically, as shown in FIG. 7 the gain control subsystem may include an RF/IF gain control portion 410. In different implementations, various gain control elements may be present in an analog front end. These gain control elements may include gain control in a LNA, gain control via a capacitive attenuation network, and one or more programmable gain amplifiers (PGAs) in an IF portion. As seen, communication between these gain control elements and a microcontroller 480 may be by way of an embedded peripheral bus 405.

After conversion of the analog signals down to an IF frequency that may be processed within the DSP, an AGC step correction block 420 may perform gain control. Then after channelization in a channel filter 430, ZIF AGC block 440 may perform gain control. Finally, after the various filtering and demodulation of an ATV signal, additional gain control may be performed in CVBS AGC block 460. As seen, each of these gain control blocks may be controlled via microcontroller 480. As further seen, during sound demodulation a sound AGC block 470 may provide gain control. Of course in other implementations, additional gain control elements may be present. To provide the user a user interface to microcontroller 480, in one embodiment a user interface 490, which may be an I$^2$C interface may be provided.

In general, gain changes in the analog front end (both the RF and IF sections) may be performed less frequently than gain changes in the DSP. Still further, in general the digital gain changes may act to compensate for the analog gain changes. As an overview of gain planning and control, because the front end gain elements are adjusted infrequently (in comparison to the digital section), some errors may be accumulated and can be tracked out in the digital compensation components. In one embodiment, digital gain changes may occur every horizontal line, while typically the RF gain changes may occur every vertical frame. Thus one or more RF gain control elements may be updated during vertical blanking intervals, and one or more digital gain elements can be updated during horizontal blanking intervals.

Figure 8:
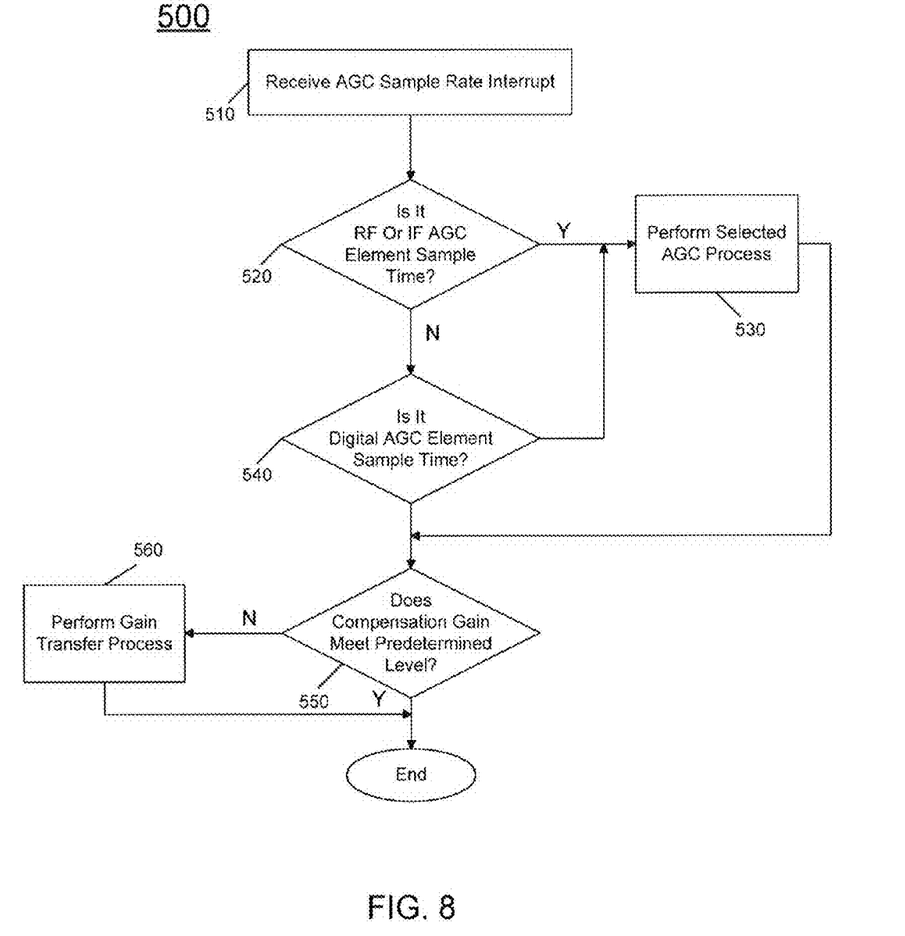
FIG. 8 is a flow diagram of a method for performing automatic gain control for various components of a tuner in accordance with one embodiment of the present invention.

Referring now to FIG. 8, shown is a flow diagram of a method for performing automatic gain control for various components of a tuner in accordance with one embodiment of the present invention. As shown in FIG. 8, method 500 may be implemented to perform gain control functions for both analog and digital components, ranging all the way from RF components down to baseband components of the DSP. As seen in FIG. 8, method 500 may begin by receiving an AGC sample rate interrupt (block 510). This interrupt may be set at different frequencies in different embodiments. Then it may be determined whether it is a sample time for a given RF or IF gain element (diamond 520). If so, the output of the corresponding gain element may be sampled and a selected AGC process may be performed for the selected AGC element (block 530). In different implementations, different algorithms for performing gain control may be used for different gain control elements. From block 530, control passes to block 560, discussed below.

Otherwise if it is not time for sampling of an analog gain control element, control passes to diamond 540 where it may be determined whether it is time for sampling of a digital AGC element. If so, control passes again to block 530 for performance of the gain control process for the digital element. Note that an algorithm used to perform digital control may be different than an algorithm for the RF and IF elements.

Otherwise, if a digital gain element is not to be sampled, control passes to diamond 550, where it may be determined whether a compensation gain meets a predetermined level. If so, method 500 may conclude for that AGC sample rate interrupt. Otherwise, control passes to block 560, wherein a gain transfer process may be performed. Specifically, this gain transfer process may be used to update control of both a compensation gain element such as step AGC compensation block 115 of FIG. 2 and a ZIF gain element such as ZIF AGC block 160 of FIG. 2. In one implementation, each of these gain control elements may be updated in opposite directions, based on whether the compensation gain is above or below the predetermined level. In one embodiment the predetermined level may be zero db. While shown with this particular implementation in the embodiment of FIG. 8, the scope of the present invention is not limited in this regard. For example, in other implementations additional gain control elements may be present and also updated. Furthermore, understand that in many implementations the digital gain control elements may have a faster rate of sampling and updating than the RF and IF elements.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
a digital signal processor (DSP) to perform a plurality of DSP operations on an incoming signal, wherein the DSP is to perform the DSP operations in a first order if the incoming signal is an analog TV (ATV) signal and is to perform the DSP operations in a second order if the incoming signal is digital TV (DTV) signal, wherein the DSP is reconfigurable under control of a microcontroller to perform the DSP operations in the first order and the second order based on the incoming signal, to handle a plurality of TV standards; and
the microcontroller coupled to the DSP to configure the first order and the second order based on the incoming signal, determine an operating mode and configure the DSP based on the operating mode, and control channel selection, sample rate selection, and gain control of the DSP.

2. The apparatus of claim 1, wherein the DSP is to demodulate the ATV signal, comprising a frequency multiplex of modulated television video and sound carriers, into separate baseband video and sound channels when operating as an ATV demodulator, and to condition the DTV signal for demodulation in a different component coupled to the apparatus when the apparatus operates as a DTV tuner.

3. The apparatus of claim 2, wherein the DTV signal is to be provided to the different component digitally via a serial digital interface coupled between the DSP and the different component.

4. The apparatus of claim 1, wherein the DSP is to provide an intermediate frequency (IF) ATV signal to a different demodulator coupled to the DSP and is to further process and demodulate the IF ATV signal to obtain timing information for the microcontroller coupled to the DSP.

5. The apparatus of claim 4, wherein the DSP is to further perform video demodulation of the IF ATV signal to determine a location within the ATV signal at which to perform a step change in at least one gain stage of an analog tuner coupled to the DSP.

6. The apparatus of claim 5, wherein the DSP is to provide the location to the at least one analog tuner gain stage, the location corresponding to a blanking interval of the ATV signal or a predetermined instance in the ATV signal, and the microcontroller is to provide gain control information to the at least one analog tuner gain stage.

7. The apparatus of claim 6, wherein the DSP is to receive a gain control signal from the different demodulator and to provide the gain control signal to the microcontroller, wherein the microcontroller is to provide the gain control information based on the gain control signal.

8. The apparatus of claim 2, where the DSP includes a plurality of functional blocks that form a signal path, wherein the ATV and DTV signals are to be operated on in the plurality of functional blocks, and wherein a signal path for the ATV signal is different than a signal path for the DTV signal.

9. The apparatus of claim 8, wherein the signal path for the ATV signal includes a demodulator to demodulate the ATV signal, a Nyquist filter to filter the demodulated ATV signal, a rescaler to rescale the Nyquist filtered signal, a notch filter coupled to the rescaler, a gain stage coupled to the notch filter, a video filter coupled to the gain stage, an all-pass filter network coupled to the video filter, a slope filter coupled to the all-pass filter network, and a gain control stage coupled to an output of the slope filter.

10. The apparatus of claim 9, wherein the Nyquist filter is to slope the incoming signal and to reject at least one adjacent channel, the Nyquist filter comprising a complex baseband finite impulse response filter, wherein only a real component of the complex filter resultant is to be output from the Nyquist filter.

11. The apparatus of claim 8, wherein the signal path for the DTV signal includes a video filter to filter the DTV signal, a frequency shifter to frequency shift the DTV signal to a LIF frequency, and a gain control stage, wherein the frequency shifter and the gain control stage are useable as a sound demodulator for an ATV signal.

12. The apparatus of claim 1, wherein the DSP includes a phase lock loop (PLL) to downconvert an incoming frequency (IF) ATV signal to a baseband signal, the PLL to tolerate the impairment of overmodulation and capable of detecting phase inversion in a carrier resulting from the overmodulation.

13. The apparatus of claim 12, further comprising an inversion detector coupled to the PLL to determine if the inversion occurred and to cause the inverted signal to be uninverted, the inversion detector including a detector to determine a polarity of a sample of the signal, a counter to be updated if the polarity is of a first state, and a latch to cause the inverted signal to be uninverted if the counter value exceeds a threshold.

14. A television tuner comprising:
an analog front end to receive and downconvert a radio frequency (RF) signal to an intermediate frequency (IF) signal, the RF signal to be one of an analog TV (ATV) signal and a digital TV (DTV) signal, and according to one of a plurality of global standards;
a digital signal processor (DSP) coupled to the analog front end to downconvert the IF signal to a zero intermediate frequency (ZIF) signal and to perform a set of functions on the ZIF signal using a reconfigurable set of blocks configured in a first order if the RF signal is an ATV signal and to perform a second set of functions on the ZIF signal using the reconfigurable set of blocks configured in a second order if the RF signal is a DTV signal, wherein the DSP is to demodulate the ATV signal; and a microcontroller coupled to the DSP to configure the first order and the second order based on the type of RF signal, and to calibrate functions of the analog front end, determine operating mode and configure the DSP based on the operating mode, and control RF channel selection, sample rate selection, and gain control of the analog front end and the DSP.

15. The television tuner of claim 14, wherein the microcontroller is to provide gain control information to the analog front end based at least in part on timing information recovered in the DSP from a CVBS signal when the television tuner operates on an ATV signal, the gain control information corresponding to discrete step information.

16. The television tuner of claim 15, wherein the DSP is to provide a modulated ATV output to a demodulator coupled to the television tuner and is to further demodulate the modulated ATV signal to obtain the timing information.

17. The television tuner of claim 14, wherein the microcontroller is, based on a frequency of at least one of the RF signal, the IF signal, and a mixing signal, to adjust a digital clock of the DSP from a first frequency to a second frequency to reduce noise in the analog front end due to a harmonic of the digital clock.

18. The television tuner of claim 17, wherein the microcontroller is to reconfigure coefficients of at least one of a compensation filter, a channelization filter, a video filter, a notch filter, and a sound filter of the DSP.

19. The television tuner of claim 14, wherein the DSP is to perform digital image rejection to remove image information from a channel signal obtained from the ATV signal.

20. The television tuner of claim 14, wherein the microcontroller is to provide the ATV signal to a sound demodulator of the DSP from a first location of a signal path prior to carrier demodulation or a second location of the signal path after the carrier demodulation, based on a type of demodulation for the ATV signal.

21. A method comprising:

receiving a radio frequency (RF) signal in an analog front end of a television tuner and downconverting the RF signal to an intermediate frequency (IF) signal, the RF signal one of an analog TV (ATV) signal and a digital TV (DTV) signal;

downconverting the incoming signal in a digital signal processor (DSP) coupled to the analog front end to downconvert the IF signal to a zero intermediate frequency (ZIF) signal and performing a set of functions on the ZIF signal using a reconfigurable set of blocks configured in a first order if the RF signal is an ATV signal and performing a second set of functions on the ZIF signal using the reconfigurable set of blocks configured in a second order if the RF signal is a DTV signal; and configuring the first order and the second order based on the type of RF signal in a microcontroller coupled to the DSP.

22. The method of claim 21, further comprising determining a location of a vertical blanking interval of the TV signal, causing at least one RF or IF gain control element of the analog front end to be adjusted by a first step change during the vertical blanking interval or a predetermined instant of the TV signal, determining a location of a horizontal blanking interval of the television signal, and causing at least one digital gain control element of the DSP to be adjusted by a second step change during the horizontal blanking interval to compensate for the first step change.

* * * * *